May 1, 1956 E. V. AMY ET AL 2,744,167

BOOSTER AMPLIFIER

Filed Dec. 14, 1950 3 Sheets-Sheet 1

INVENTORS.
ERNEST V. AMY.
JULIUS G. ACEVES.
BY Ward, Crosby & Neal
ATTORNEYS.

INVENTORS.
ERNEST V. AMY.
JULIUS G. ACEVES.
BY Ward, Crosby & Neal
ATTORNEYS.

BOOSTER AMPLIFIER

Filed Dec. 14, 1950 3 Sheets-Sheet 3

INVENTORS.
ERNEST V. AMY.
JULIUS G. ACEVES.
BY Ward, Crosby & Neal
ATTORNEYS.

United States Patent Office 2,744,167

Patented May 1, 1956

2,744,167

BOOSTER AMPLIFIER

Ernest V. Amy, Atlantic Beach, and Julius G. Aceves, New York, N. Y., assignors to Amy, Aceves & King, Inc., New York, N. Y., a corporation of New York Application December 14, 1950, Serial No. 200,752

5 Claims. (Cl. 179—171)

This invention relates to electrical amplifiers and more particularly, to an amplifier which may be used to preamplify signals supplied to a television receiver and which is automatically energized when the receiver is energized.

At certain locations of a receiver, such as a television receiver, the strength of the received signal may not be sufficient with a conventional receiver to provide a satisfactory output. For example, when the receiver is at a considerable distance from a television transmitter, the signal may not be strong enough to produce a clear, stable picture.

Special receivers could be made which would be adequate for use in low signal strength areas, but in addition to being more expensive to make because of added circuits which would be required, there is not a demand for such receivers in sufficient quantity to obtain the low costs which result from volume production. For these and other reasons, it has been found to be desirable to manufacture amplifiers known as booster amplifiers which are employed in the form of an attachment to a conventional receiver.

Present day frequency allocations for television transmissions require a booster amplifier which will amplify signals at several different frequencies within two widely separated frequency bands. Because of the difficulty in making an amplifier which will give adequate gain under these conditions without tuning, it has been the general practice to provide station or band selection in the amplifier. With the large number of controls already on a conventional television receiver, it is highly undesirable to provide additional tuning controls on a booster amplifier which controls must be operated by an unskilled operator. Furthermore, it may be desirable to locate the amplifier in an obscure position.

Booster amplifiers must also be electrically energized because they usually include thermionic vacuum tubes. Separate control of the energization of a booster amplifier is undesirable for the same reasons that added tuning controls are undesirable and in addition, for the reason that an operator may overlook turning off the booster amplifier when the receiver is turned off and hence, the life of the amplifier is shortened. The energization of the booster amplifier could be controlled by the on-off switch of the receiver, but this requires changes in the internal wiring of the receiver which means that the amplifier cannot be installed by unskilled persons and the cost of installation is increased.

It is an object of our invention to provide a booster amplifier which is automatically energized when a receiver associated therewith is energized and which requires no tuning.

It is a further object of our invention to provide a booster amplifier which is simple to manufacture, and economical to operate and which may be installed and operated by unskilled persons.

It is a further object of our invention to provide a booster amplifier which does not produce large amounts of unused heat, which does not rely upon mechanical devices, such as relays, for its operation and which has a relatively long life.

Other objects and advantages of the invention will be apparent from the description of specific embodiments of the invention given hereinafter by way of example only and setting forth the manner in which we now prefer to practice the invention.

In accordance with the preferred embodiment of our invention, the booster amplifier comprises a pair of vacuum tubes having input and output circuits which are tuned broadly so as to amplify signals at all frequencies within two different frequency bands. One of the vacuum tubes with its associated circuits amplify the signals in one frequency band and the other tube and its circuits amplify signals in the other frequency band. The circuits are coupled together so that when the amplifier is inserted between a receiving antenna and a receiver, the signals in both bands are supplied to the receiver at a level greater than their level at the antenna, the signals at all desired frequencies being supplied at substantially the same level without tuning of the amplifier when the tuning of the receiver is changed. The filaments of the vacuum tubes are energized by a transformer which is connected in series between the power source for the receiver and the receiver power input line, and the remainder of the amplifier is energized by a circuit including a rectifier, such as a plate rectifier of the selenium or copper oxide type, which is connected to the power source and does not consume energy until the filaments are energized, and direct current flows through the tubes. As used herein, the term "filament" is intended to include not only a wire heated by the passage of current therethrough and used as a cathode in a vacuum tube but also the heater of an indirectly heated cathode or any other element or elements of a vacuum tube which consumes power for the purpose of producing electron emission in the tube.

Accordingly, our invention comprises a broad band, vacuum tube amplifying circuit which requires no tuning during operation of an associated receiver and which is energized by the flow of the receiver energizing alternating current through a transformer.

Our invention may be better understood by referring to the following detailed description of the invention and to the accompanying drawings, in which.

Figure 1:
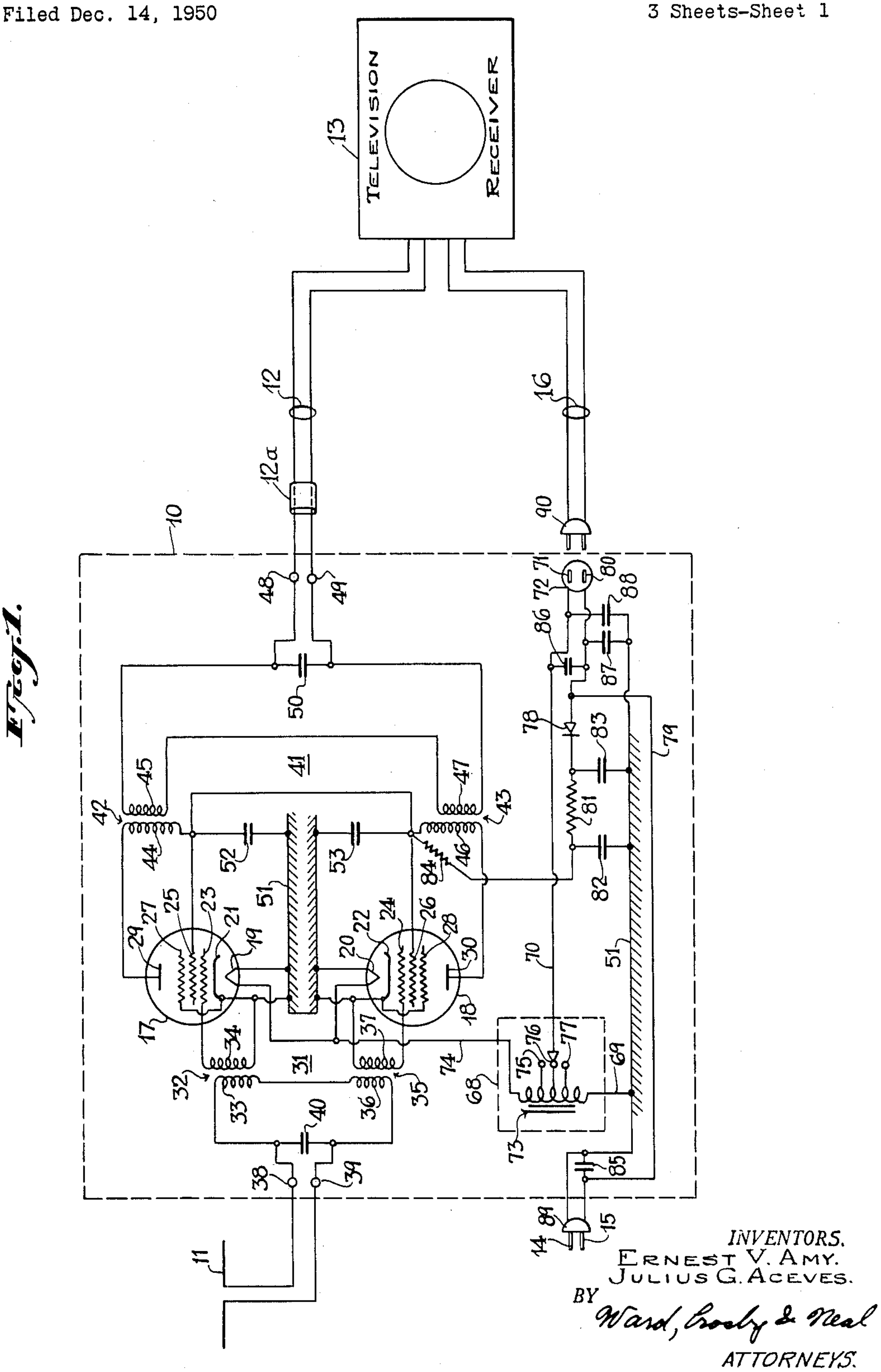
Fig. 1 is a schematic diagram showing a booster amplifier of our invention associated with a television receiver.

Referring to Fig. 1, a booster amplifier of our invention is shown within a dotted rectangle 10. The booster amplifier 10 is connected between an antenna 11 and the radio frequency input line 12 of a television receiver 13 and between a power source which may be connected to the power input terminals 14 and 15 and the power input line 16 of the television receiver 13.

The booster amplifier 10 may be considered as comprising two different sections, a radio frequency section and a power section. The radio frequency section comprises a pair of vacuum tubes 17 and 18, preferably of the pentode type. In the preferred form, the vacuum tubes have filaments 19 and 20, cathodes 21 and 22, control grids 23 and 24, screen grids 25 and 26, suppressor grids 27 and 28 and anodes 9 and 30. Connected to the control grids 23 and 24 is an input circuit designated generally by the numeral 31 which comprises a first transformer 32 having a primary winding 33 and a secondary winding 34 and a second transformer 35 having a primary winding 36 and a secondary winding 37. The primary windings 33 and 36 are connected in series with each other to radio frequency input terminals 38 and 39. A condenser 40 is connected across the input terminals 38 and 39 to improve the gain of the amplifier.

The radio frequency section also comprises an output circuit designated generally by the numeral 41 which comprises a pair of transformers 42 and 43 having primary windings 44 and 46 and secondary windings 45 and 47. The secondary windings 45 and 47 are connected in series with each other to radio frequency output terminals 48 and 49. A condenser 50 is connected across the output terminals 48 and 49 also for the purpose of improving the gain of the amplifier.

The filaments 19 and 20 of the vacuum tubes 17 and 18 are connected electrically in parallel and are "grounded" (i. e. at the radio frequency potential of the chassis) at one end to the chassis shown schematically at 51. The cathodes 21 and 22 are also "grounded" to the chassis 51. A pair of by-pass condensers 52 and 53 are connected between the screen grids 25 and 26 and the chassis 51.

Figure 4:
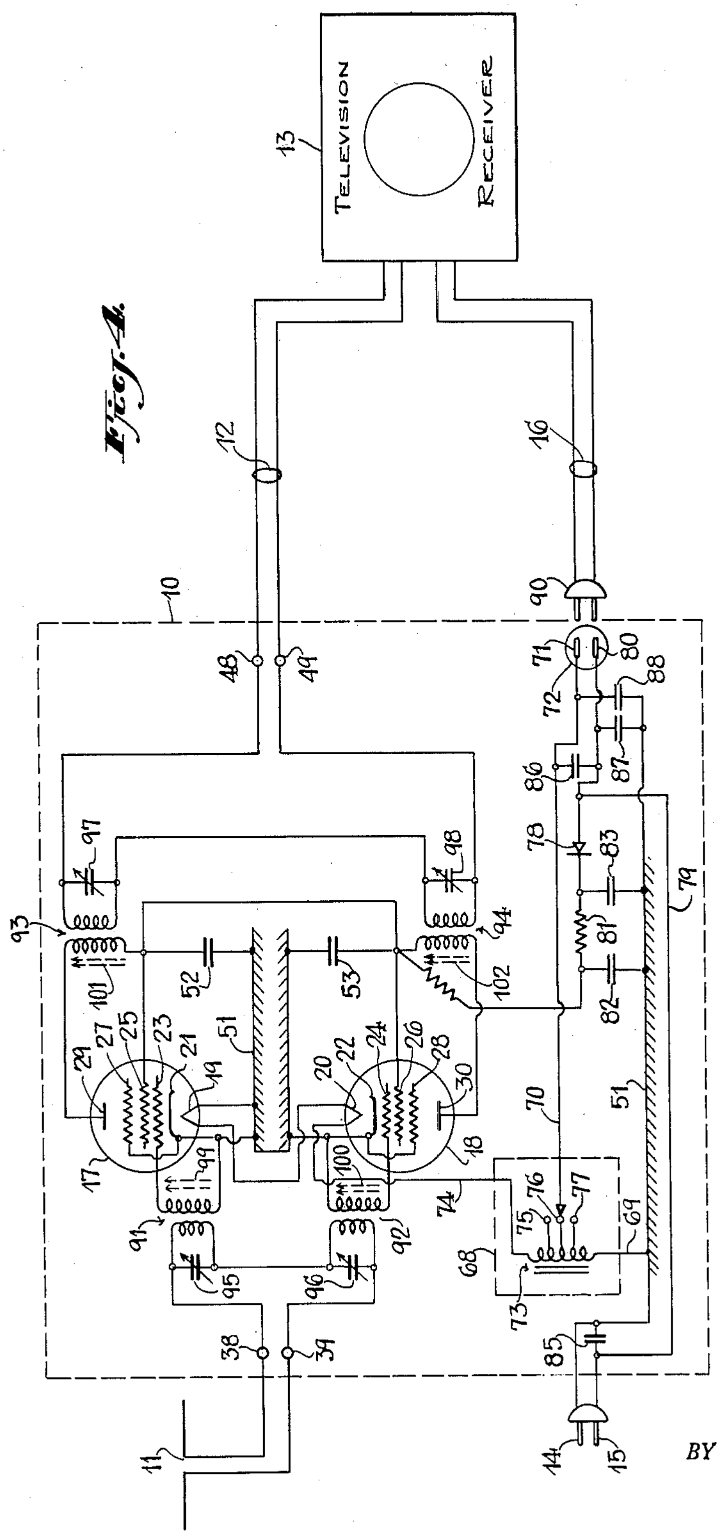
Fig. 4 is a schematic diagram of a modified form of the booster amplifier shown in Fig. 1.

The portion of the radio frequency section comprising the vacuum tube 17 and the transformers 32 and 42 is arranged to amplify signals at all frequencies within a first predetermined frequency band and the portion of the radio frequency section comprising the vacuum tube 18 and transformers 35 and 43 is arranged to amplify signals at all frequencies within a second predetermined frequency band. If the booster amplifier of our invention is used in connection with a television receiver, the first predetermined frequency band may correspond to the present day high frequency television band (174 to 216 megacycles per second) whereas the second predetermined frequency band may correspond to the present day low frequency television band (55 to 88 megacycles per second. For the purpose of amplifying signals within their respective frequency bands, the transformers 32 and 42 may be tuned broadly to the first frequency band and the transformers 35 and 43 may be tuned broadly to the second frequency band, both sets of transformers being tunable by adjustment of the number of turns and spacing of the turns of their windings. The transformers may also be tuned by condensers, by cores of magnetic material and/or by slugs of conductive material in any well known manner, such as is illustrated in Fig. 4, and both the primary and secondary windings of the transformers may be tunable in order to obtain broad band gain characteristics. If desired, the secondary windings of the input transformers 32 and 35 may be adjusted with respect to the inherent grid to cathode capacities of the tubes 17 and 18 and the stray capacity of the wiring so as to form a circuit tuned to the desired frequency. In addition to tuning of the transformers, we have found it desirable to include the condensers 40 and 50 across the radio frequency input and output terminals, respectively, for further increasing the gain of the amplifier in the first and second predetermined frequency bands.

The above-mentioned portions of the radio frequency section of the booster amplifier 10 should provide as much gain as possible within the desired frequency bands and the gain should be substantially the same at all signal frequencies within the bands. These qualifications as to the performance of the booster amplifier are desirable and are particularly difficult to meet when the amplifier is not tuned for each selected station, but we have found that they may be met with an amplifier arranged, as indicated in Fig. 1, and with the radio frequency components arranged, as shown in Figs. 2 and 3.

Figure 2:
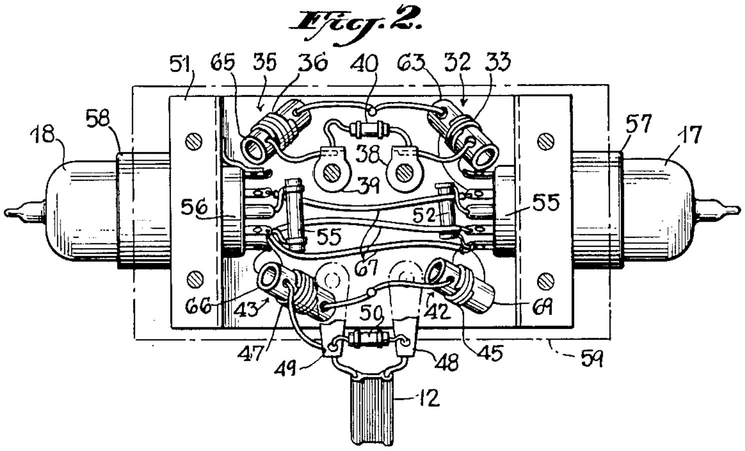
Figs. 2 and 3 are plan and side elevation views, respectively, of a portion of the booster amplifier shown in Fig. 1 illustrating the arrangement of the radio frequency components in the amplifier.
Figure 3:
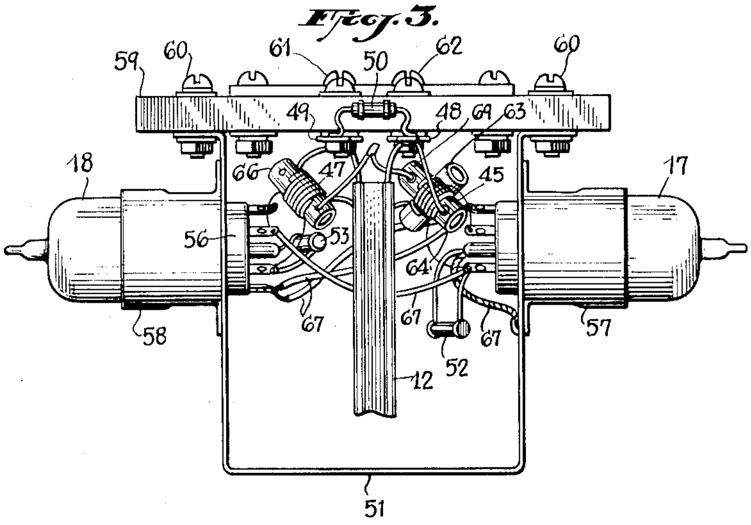

Referring to Figs. 2 and 3, the vacuum tubes 17 and 18 are shown mounted on a U-shaped chassis 51. The tubes 17 and 18 are held in sockets 55 and 56 and are surrounded at their bases by bottom portions 57 and 58 of tube shields, the remaining portions of the tube shields being omitted in the drawings for the purpose of simplicity in illustration.

An insulating terminal strip 59 is mounted at the open end of the U-shaped chassis 51 and is held thereon by means of screws 60. The radio frequency transmission line 12 which connects with the television receiver 13 may be soldered directly to the radio frequency output terminals 48 and 49 mounted on the terminal strip 59. The condenser 50 may also be soldered to the output terminals 48 and 49, as indicated.

The input transmission line from the antenna 11 may be connected to the input terminals 38 and 39 having a pair of adjustable screws 61 and 62 thereon which receive the ends of the transmission line thereunder. The condenser 40 may be soldered to the input terminals 38 and 39, as shown.

The transformers 32 and 42 have their primary and secondary windings mounted on tubular coil forms 63 and 64. The primary winding 33 and the secondary winding 45 are visible in Fig. 2 and the secondary winding 34 and primary winding 44, although not visible in Fig. 2, are wound, respectively, on the forms 63 and 64 underneath the windings 33 and 45.

The transformers 35 and 43 are shown at the left in Fig. 2. The windings of these transformers are mounted on coil forms 65 and 66 and only the windings 36 and 47 are visible because the other windings of these transformers are underneath the windings 36 and 47.

Various other interconnections between the vacuum tubes 17 and 18 are made by the leads 67 and by other leads which have not been shown in order to avoid obscuring the important radio frequency components which have been described.

Referring again to Fig. 1, the power section of the booster amplifier 10 comprises a source of filament power 68 which is connected in series with one of the television receiver power conductors 16 by a conductor 69 connected to power input terminal 14 and a conductor 70 connected to a power output terminal 71 of a receptacle 72. The vacuum tubes frequently employed for radio frequency amplification at frequencies of the order of the frequencies of television transmissions require a filament voltage of approximately 6.3 volts and a filament current in the range of .15 to .35 ampere depending on whether one or more vacuum tubes are used and whether the filaments are connected in series or in parallel. Also, present day television receivers consume from 100 to 400 watts of power in the steady state operating condition. This means that the current flowing in the power conductors 16 of the television receiver may be in the range from 1 to 4 amperes.

We have found that a transformer is preferable to other devices for supplying power to the filaments of the tubes. If, for example, the filaments 19 and 20 of the vacuum tubes 17 and 18 were energized from a resistor which is connected in series with the conductors 69 and 70, power in the range from 6 to 25 watts is wasted and must be dissipated within the housing for the booster amplifier. Furthermore, the resistor would reduce the line voltage between the conductors 16 by approximately 6 volts which may cause the television receiver 13 to be less sensitive and which may required readjustment of the television receiver controls. Furthermore, the current drawn by the television receiver 13 immediately after it is turned on may be several times the current drawn during the steady state operating condition of the receiver, and the voltage appearing across the filaments 19 and 20 would, if these filaments are connected in parallel with such a resistor, be momentarily several times the normal operating voltage of the filaments. This increase in voltage, although only momentary, will considerably reduce the lives of the filaments 19 and 20.

We have found that if the filaments 19 and 20 are energized by a transformer 73, the above-mentioned difficulties may be overcome. In the preferred form of the invention, the transformer 73 is an auto-transformer which is connected at one end to a conductor 74 connected to the filaments 19 and 20 and which has a plurality of taps 75, 76 and 77, one of which is connected to the conductor 70. The conductor 70 is connected intermediate the ends of the auto-transformer 73 because the current drawn by the television receiver 13 is greater than the current drawn by the filaments 19 and 20. There is thus a step-up ratio between the turns through which the current for the television receiver 13 flows and the turns across which the filaments 19 and 20 are connected. The stepup ratio is desirable because it not only reduces the surge current through the filaments 19 and 20 when the television receiver 13 is first turned on but also it reduces the voltage drop between the terminal 14 and the terminal 71. Under the conditions of operation assumed above, the voltage drop may be something less than 3 volts, a negligible voltage drop in comparison with the usual line voltage of 117 volts. The auto-transformer 73 may have a relatively high efficiency and, therefore, the power consumed by the transformer is very small, and usually is much less than one watt.

If desired, instead of making the connection of the conductor 70 to the transformer 73 adjustable, the conductor 70 may be fixed to a point intermediate the ends of the winding of the transformer 73, and the connection of the conductor 74 to the transformer 73 may be made adjustable.

The remaining portion of the power section of the booster amplifier 10 comprises a rectifier 78 connected to a conductor 79 which interconnects an input power terminal 15 with an output power terminal 80 of receptacle 72. The rectifier 78 may be a non-thermionic rectifier, such as a copper oxide or selenium rectifier, which consumes substantially no power until the filaments 19 and 20 are energized, but alternatively, the rectifier 78 may be a thermionic rectifier, the filament of which may be energized in the same manner as the filaments 19 and 20.

The rectifier 78 in conjunction with the filter network comprising a resistance 81 and filter condensers 82 and 83 supply a rectified voltage for the screens 25 and 26 and the anodes 29 and 30 of the vacuum tubes 17 and 18. A decoupling resistor 84 is connected between the filter network and the screens 25 and 26. Although this arrangement for supplying rectified voltage to the tubes is preferred because of its simplicity, other types of direct current power supply circuits may be employed.

To minimize the effect on the amplifier of noise voltages picked up on the power lines and to minimize coupling of the amplifier with other equipment connected to the power lines, a plurality of line filtering condensers 85, 86, 87 and 88 are connected to the power lines, as indicated in Fig. 1. These line filtering condensers particularly assist in preventing amplifier oscillations in the event that a plurality of booster amplifiers 10 are connected in cascade to increase the RF gain and are connected to the same power lines.

When the booster amplifier 10 is installed, the radio frequency transmission line normally connected between the antenna 11 and the radio frequency input to the television receiver 13 is connected between the antenna 11 and the radio frequency input terminals 38 and 39. A section of radio frequency transmission line 12 of the proper impedance is then connected between the radio frequency output terminals 48 and 49 and the radio frequency input terminals of the television receiver 13. Since the impedance of the output circuit of the booster amplifier 10 and the input impedance to the receiver 13 may vary over the bands of frequencies received, it is preferable that the length of the line 12 should be shosen so that it is an integral multiple of one-half wave length at the mid-band frequency of the higher frequency band and either a small fraction of a wave length or an integral multiple of one-half wave length at the mid-band frequency of the lower frequency band. However, small variations from these values may be tolerated, and if the impedances are substantially constant over the frequency bands, the line 12 may have any length desired. For best operation over wide bands, the length of line should be as short as possible consistent with the qualifications set forth above, and we have found that good results may be obtained when receiving signals within the present day television frequency bands which have mid-band frequency ratios of approximately three to one by employing a line 12 having a length equal to approximately one-half wave length at the mid-band frequency of the higher band. Alternatively, the line 12 may be three half-wave lengths long at the mid-band frequency of the higher frequency band.

The line 12 may also be tuned to improve the impedance match between the booster amplifier output and the receiver input by means of a conductive strap or plate 12*a*, which may be a layer of conductive foil wrapped around the line and slidable along the length of the line to obtain the desired match. The strap 12*a* may be adjusted after the booster amplifier is installed by sliding it along the line 12 until satisfactory reception is obtained for all signals in the higher frequency band, or if a signal at one frequency is weaker than the others, the strap 12*a* may be slid along the line 12 until best reception for the weakest signal is obtained.

The steady state power consumption of the television receiver 13 is then determined by examining the receiver nameplate or other markings, by consulting the receiver operating manual or by test. The taps 75, 76, 77, etc. are preferably marked with the power value required for producing the proper filament voltage, and the taps 75, 76, and 77 may, for example, be marked, respectively, 100, 200 and 300 watts. In other words, the lowest tap is used when the television receiver 13 has a large power consumption and vice versa, and when the power consumption has been determined, the conductor 70 is connected to the tap marked with a power value nearest the actual value. Of course, more taps may be provided if finer control is desired.

After the conductor 70 has been connected to the proper tap, the power plug 89 comprising the power input terminals 14 and 15 may be plugged into a power receptacle providing a voltage suitable for the television receiver 13. The power plug 90 of the television receiver may then be plugged into receptacle 72 of the booster amplifier 10.

With the booster amplifier 10 connected, as indicated above, the booster amplifier is energized as soon as the "on-off" switch of the television receiver is turned to the "on" position. The radio frequency section of the booster amplifier 10 then amplifies signals received by the antenna 11 within the predetermined frequency bands and supplies them at a level higher than the level at the radio antenna 11 to the radio frequency input terminals of the television receiver 13. It will be noted that irrespective of the tuning of the television receiver 13 within the operating frequency bands, no tuning of the radio frequency of the booster amplifier 10 is required. Similarly, it is unnecessary to operate any control of the booster amplifier 10 to either energize or de-energize the booster amplifier 10 when the television receiver 13 is turned on and off.

Although in Fig. 1, we have shown radio frequency input and output circuits of one type and the filaments 19 and 20 connected in parallel, it is possible within the scope of our invention to use other types of radio frequency input and output circuits and to connect the filaments 19 and 20 in series. Referring to Fig. 4, in which components indentical with those shown in Fig. 1 have the same reference numerals, it will be seen that the condensers 40 and 50 have been omitted, and the radio frequency transformers 91, 92, 93 and 94 are tunable by condensers 95, 96, 97 and 98 and/or by magnetic cores or conductive slugs 99, 100, 101 and 102. Also, the filaments 19 and 20 are connected in series. Although both condenser tuning and inductive tuning of the transformers have been shown, either type of tuning may be used without the other type of tuning.

The input and output circuits comprising the transformers 91–94 are tuned to frequency bands in the same manner as the input circuit 31 and the output circuit 41 of Fig. 1 are tuned. Since the radio frequency input and output circuits shown in Fig. 4 are conventional and since the operation of the booster amplifier 10 of Fig. 4 is the same as the booster amplifier 10 shown in Fig. 1, the operation of the amplifier is apparent to those skilled in the art.

Figure 5:
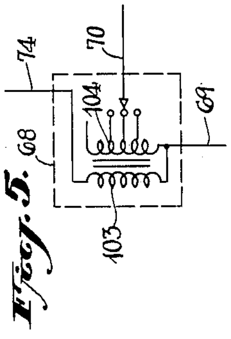

Although the filament power source 68 described in connection with Figs. 1 and 4 includes an auto-transformer, the auto-transformer may be replaced by a transformer of the type shown in Fig. 5. The transformer shown in Fig. 5 has a secondary winding 103 and a tapped primary winding 104. The filaments 19 and 20 of vacuum tubes 17 and 18 are connected across the secondary winding 103 and are energized by flow of television receiver power current in the primary winding 104. As mentioned above in connection with the auto-transformer 73, the conductor 70 is connected to a point on winding 104 which will produce the desired filament voltage across the secondary winding 103. Also, as mentioned in connection with the transformer 73, the connection of the conductor 70 to the primary winding 104 may be fixed and the secondary winding 103 may be tapped so as to permit adjustment of the connection of the conductor 74 to the winding 103.

Figure 6:
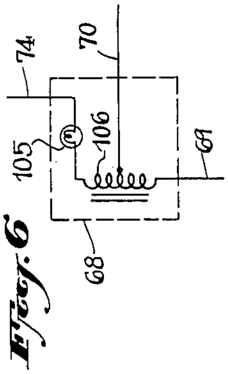

If it is desired to avoid adjustment of the connection point of the conductors 70 or 74 on the transformer in the filament power source 68 with changes in the amount of power consumed by an associated television receiver, the conductor 70 may be permanently fixed to a point on the filament power source transformer, as indicated in Fig. 6. The current drawn by the filaments 19 and 20 is then controlled by a regulator or ballast tube 105 connected in series with the winding 106 of the transformer. Ballast tube 105 may be a current responsive resistance constructed in any well known manner so as to maintain the current drawn by the filaments 19 and 20 constant independently of the magnitude of the voltage (within limits) appearing across the winding 106.

Figure 7:
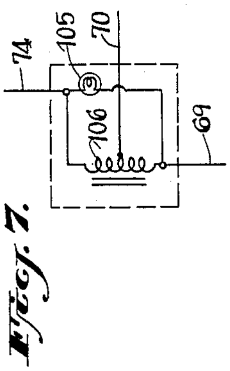
Figs. 5, 6 and 7 are schematic diagrams illustrating alternative arrangements of the filament power source associated with booster amplifiers of our invention.

As shown in Fig. 7, the ballast tube 105 may be connected in parallel with the winding 106 rather than in series with the winding 106, as shown in Fig. 6. Similarly, any desired series or parallel combination of ballast tube 105 with the winding 106 may be employed.

As indicated above, it is possible to avoid adjustment of the conductors 70 or 74 on the transformer in the filament power source 68 by employing ballast tubes connected in series or in parallel with the filament power source transformer, but in the preferred embodiment of the invention, the use of ballast tubes is eliminated by employing a saturable core transformer which may be an auto-transformer or a two-winding transformer and which may be substituted for any of the transformers heretofore described. With a saturable core transformer, the conductor 70 is permanently connected to a predetermined point on a winding of the transformer, and the number of turns of the transformer winding or windings and the core material and size are so proportioned in a well known manner that the desired filament voltage is obtained at the output of the transformer, substantially independent of the current drawn by the television receiver. When a television receiver requiring a small input current is connected to the booster amplifier 10, the core of the transformer is either saturated or substantially at its saturation point and when a television receiver requiring a larger input current is connected to the booster amplifier 10, the transformer core is saturated so that the output voltage of the transformer and hence, the voltage applied to the filaments of the amplifier vacuum tubes remains at substantially the desired voltage, regardless of the current drawn by the television receiver. For optimum performance, the saturated core transformer also may have one or two taps in order to limit more closely the filament voltage, regardless of the power drawn by the television receiver.

Having thus described our invention with particular reference to the preferred form thereof and having shown and described certain modifications, it will be obvious to those skilled in the art to which the invention pertains, after understanding our invention, that various changes and other modifications may be made therein without departing from the spirit and scope of our invention, as defined by the claims appended hereto.

What is claimed as new and desired to be secured by Letters Patent of the United States is:

1. A booster amplifier for connecting a further amplifier having a signal circuit for selectively receiving and translating signals in a predetermined frequency band and a power energizing circuit to respectively a source of said signals and a power source, said booster amplifier comprising a signal amplifying circuit for amplifying said signals and including a vacuum tube having a filament, a transformer having an input circuit and an output circuit, said output circuit being connected in series with said filament, means for connecting said signal amplifying circuit in series between said source of signals and said signal circuit and means for connecting said input circuit of said transformer in series between said power source and said power energizing circuit and for thereby causing the current in said power energizing circuit to flow in said input circuit whereby said filament is energized whenever said further amplifier is energized.

2. A booster amplifier for connecting a further amplifier having a signal circuit for selectively receiving and translating signals in a predetermined frequency band and a power energizing circuit to respectively a source of said signals and a power source, said booster amplifier comprising a signal amplifying circuit for amplifying said signals and including a vacuum tube having a filament, an auto-transformer having a winding, two separate points on said winding being connected to the ends of said filament, means for connecting said signal amplifying circuit in series between said source of said signals and said signal circuit and means for connecting one point on said winding to said power source and means for connecting a further point on said winding different from said one point and from one of said two separate points to said power energizing circuit and for thereby causing the current in said power energizing circuit to flow in a portion of said winding whereby said filament is energized whenever said further amplifier is energized.

3. A booster amplifier for connecting a further amplifier having a signal circuit for selectively receiving and translating signals in a predetermined frequency band and a power energizing circuit to respectively a source of said signals and a power source, said booster amplifier comprising a signal amplifying circuit for amplifying said signals and including a vacuum tube having a filament operable by a predetermined current, a transformer having an input circuit, an output circuit and a saturable core, said output circuit being connected in series with said filament and said core being saturated with current flowing in said input circuit in excess of that required to produce said predetermined current in said output circuit, means for connecting said signal amplifying circuit in series between said source of said signals and said signal circuit and means for connecting said input circuit of said transformer in series between said power source and said power energizing circuit and for thereby causing the current in said power energizing circuit to flow in said input circuit whereby said filament is energized whenever said further amplifier is energized.

4. A booster amplifier for connecting a further amplifier having a signal circuit for selectively receiving and translating signals in a predetermined frequency band and a power energizing circuit to respectively a source of said signals and a power source, said booster amplifier comprising a pair of signal amplifying circuits for amplifying said signals and each including a vacuum tube having a filament, one of said amplifying circuits amplifying signals in a first predetermined frequency band and the other of said amplifying circuits amplifying signals in a second predetermined frequency band, a transformer having an input circuit and an output circuit, said output circuit being connected in series with the filaments of the tubes in said amplifying circuits, means for connecting said signal amplifying circuits in series between said source of said signals and said signal circuit, said means including a transmission line connected between both said amplifying circuits and said signal circuit and having a length substantially equal to an integral multiple of one-half wave length at the mid-band frequency of said first predetermined frequency band, and means for connecting said input circuit of said transformer in series between said power source and said power energizing circuit and for thereby causing the current in said power energizing circuit to flow in said input circuit whereby said filament is energized whenever said further amplifier is energized.

5. An amplifier system comprising a first amplifier having a signal input circuit for selectively receiving and translating signals in a predetermined frequency band and an energizing power input circuit connected to said amplifier for energizing said amplifier, said power input circuit having a predetermined energizing current flowing therein when said first amplifier is energized, a second amplifier for amplifying said signals comprising at least one vacuum tube amplifier stage having a signal output circuit, said vacuum tube having a filament which operates with a predetermined filament current flowing therethrough, a transformer having an output circuit connected in series with said filament and having an input circuit connected in series between the input of said energizing power circuit and a power source for thereby causing said energizing current to flow in said input circuit of said transformer, said transformer producing said predetermined filament current in its output circuit with said predetermined energizing current flowing in the input circuit thereof and means connecting said signal output circuit to said signal input circuit.

References Cited in the file of this patent

UNITED STATES PATENTS

| | | |
|---|---|---|
| 694,190 | Privat | Feb. 25, 1902 |
| 812,038 | Hessberger | Feb. 6, 1906 |
| 2,006,994 | Hopkins | July 2, 1935 |
| 2,224,207 | Wilhelm | Dec. 10, 1940 |
| 2,228,112 | Hansell | Jan. 7, 1941 |
| 2,266,197 | Hansell | Dec. 16, 1941 |
| 2,268,672 | Plebenski | Jan. 6, 1942 |
| 2,283,926 | Harvey | May 26, 1942 |
| 2,429,775 | Seright | Oct. 28, 1947 |
| 2,484,733 | Rahmel et al. | Oct. 11, 1949 |
| 2,484,734 | Rahmel | Oct. 11, 1949 |
| 2,492,196 | Serratt | Dec. 27, 1949 |
| 2,523,173 | Winters | Sept. 19, 1950 |
| 2,595,444 | Becker | May 6, 1952 |
| 2,621,253 | Meers | Dec. 9, 1952 |